United States Patent
Min et al.

(10) Patent No.: US 7,223,701 B2
(45) Date of Patent: May 29, 2007

(54) IN-SITU SEQUENTIAL HIGH DENSITY PLASMA DEPOSITION AND ETCH PROCESSING FOR GAP FILL

(75) Inventors: Kyu S. Min, San Jose, CA (US); Oleh P. Karpenko, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 625 days.

(21) Appl. No.: 10/236,203

(22) Filed: Sep. 6, 2002

(65) Prior Publication Data

US 2004/0048485 A1 Mar. 11, 2004

(51) Int. Cl.
*H01L 21/302* (2006.01)
(52) U.S. Cl. .................... 438/714; 438/694; 438/706
(58) Field of Classification Search ................ 438/706, 438/710, 712, 720, 694, 695, 697, 714
See application file for complete search history.

(56) References Cited

U.S. PATENT DOCUMENTS

| | | | |
|---|---|---|---|
| 5,960,300 A * | 9/1999 | Yabu et al. ............... 438/436 |
| 6,030,881 A | 2/2000 | Papasouliotis et al. ...... 438/424 |
| 6,106,678 A * | 8/2000 | Shufflebotham et al. ...... 204/192.32 |
| 6,335,288 B1 * | 1/2002 | Kwan et al. ................ 438/694 |
| 6,440,864 B1 * | 8/2002 | Kropewnicki et al. ....... 438/710 |
| 6,537,421 B2 * | 3/2003 | Drewery ................ 156/345.48 |
| 6,544,380 B2 * | 4/2003 | Tomoyasu et al. ..... 156/345.51 |
| 6,635,185 B2 * | 10/2003 | Demmin et al. .............. 216/64 |
| 6,723,653 B1 * | 4/2004 | Kim ........................... 438/723 |
| 2003/0207580 A1 * | 11/2003 | Li et al. ..................... 438/700 |

* cited by examiner

*Primary Examiner*—Lan Vinh
(74) *Attorney, Agent, or Firm*—Trop, Pruner & Hu, P.C.

(57) ABSTRACT

During microelectronic processing of a substrate, a gap on the substrate surface may be filled with a material by alternating deposition and etch processes while the substrate remains in the same process chamber. Alternating deposition and etch processes allows the gap to be completely filled absent a void.

34 Claims, 2 Drawing Sheets

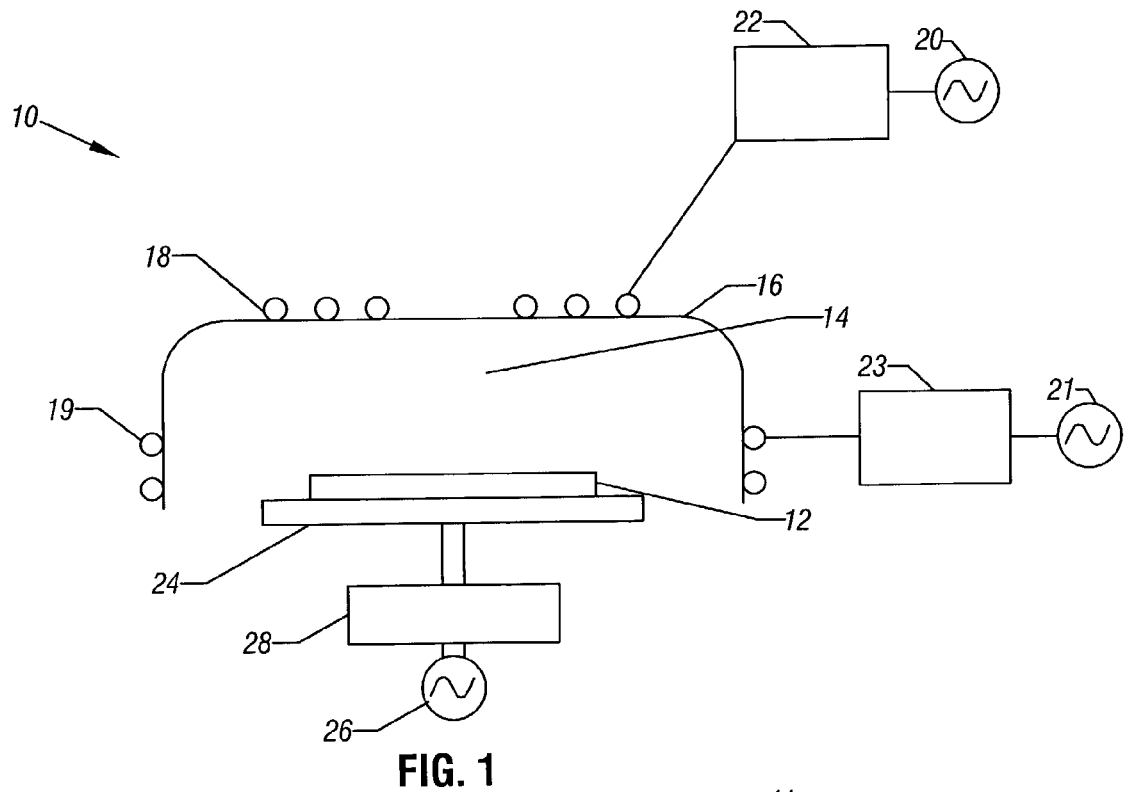
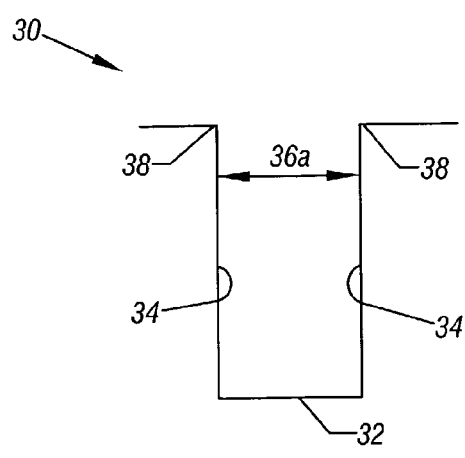
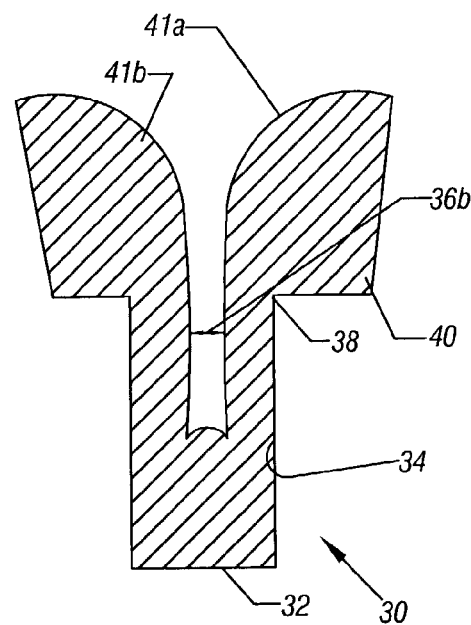
FIG. 1
FIG. 2
FIG. 3

IN-SITU SEQUENTIAL HIGH DENSITY PLASMA DEPOSITION AND ETCH PROCESSING FOR GAP FILL

BACKGROUND

This invention relates generally to microelectronic processing and in particular to filling one or more spaces on the surface of a substrate.

Plasma assisted deposition of films is widely used in microelectronics manufacturing. For example, dielectric films are often deposited in gaps or trenches on a substrate surface for use in isolation, passivation and barrier applications. However, completely filling a gap with the deposited material may prove to be challenging. This is especially true for those gaps having a high depth to width ratio. For example, typical deposition plasmas tend to deposit a non-uniform film in the gap that results in excess deposition at or near the opening of the gap as compared to the bottom of the gap. As a result, a void may form in the gap.

Generally, voids are undesirable because the electrical or physical isolation to be provided by the gap is disrupted. Thus, if present, voids may cause degradation in the performance of or even the failure of the circuit in which they occur.

Therefore, there is a continuing need for microelectronic processing techniques to deposit films that fill gaps on the surface of a substrate.

BRIEF DESCRIPTION OF THE DRAWINGS

FIG. 1 is a schematic of a device utilized to fill one or more gaps on the surface of a substrate according to embodiments of the present invention;

FIG. 2 is an enlarged cross-sectional view of a gap to be filled with a deposited material according to embodiments of the present invention;

FIG. 3 is an enlarged cross-sectional view of a gap post-first deposition processing that is partially filled and has an opening with a reduced width according to some embodiments of the present invention;

DETAILED DESCRIPTION

Figure 6:
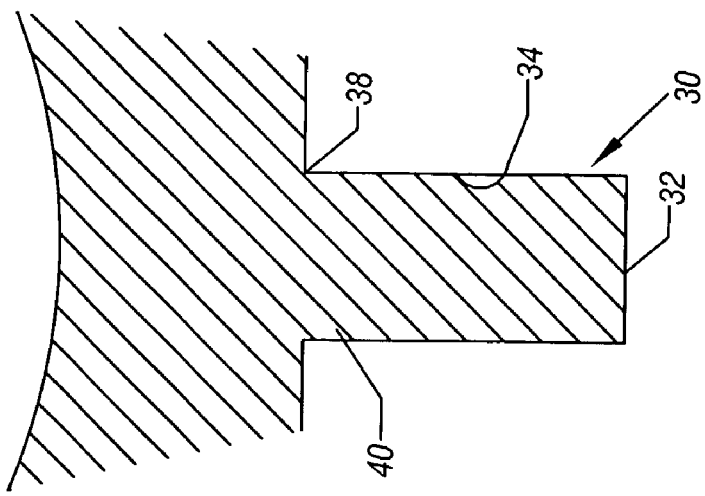
FIG. 6 is an enlarged cross-sectional view of the gap of FIG. 5 post-subsequent deposition processing according to embodiments of the present invention.

Referring to FIG. 1, a reactor 10 such as any one of the Ultima high density plasma (HDP) chemical vapor deposition (CVD) products (Applied Materials®, 3050 Bowers Avenue, Santa Clara, Calif. 95054) may be utilized for the sequential deposition, etching and further deposition of a film on the surface of a substrate 12 such as a wafer. Particularly, one or more gaps on the surface of the substrate 12 may be filled by sequential deposition, etch and further deposition processes. The substrate 12 may be any substrate for microelectronic processing such as a wafer including 200 and 300 mm sized wafers, although the scope of the invention is not limited in this respect. Further, the gaps may be any space between devices or device features such as a trench or via.

An exemplary reactor 10 may comprise a plasma processing chamber 14, a first radio frequency (RF) source 20, a second RF source 21, a bias RF source 26, a gas delivery system (not shown) and a vacuum system (not shown). The plasma processing chamber 14, which is defined by a dome 16, may be a vacuum chamber that houses the substrate 12 during HDP-CVD and HDP etch processing.

A first inductive coil 18 is mounted on the top of the dome 16. The first or top coil 18 is powered by a top RF source 20, which is typically inductively coupled to the coil 18 through an impedance matching device 22. Similarly, a second inductive coil 19 is mounted on the side of the dome 16. The second or side coil 19 is inductively coupled to the RF source 21 through an impedance matching device 23. Thus, the impedance matching devices 22 and 23 match the impedance of RF sources 20 and 21, respectively, with their respective coils 18 and 19. In some embodiments, the RF sources 20 and 21 may provide between 100 and 5,000 Watts of RF power at a frequency of about 2.0 MHz. However, in other embodiments, the RF sources 20 and 21 may provide more or less power depending upon the size of the substrate 12. Advantageously, the inductive coils 18 and 19 are powered separately to improve the density and perhaps the uniformity of the plasma. In turn, this may improve deposition and/or etch processing.

Generally, the inductive RF sources 20 and 21 energize a gas mixture that has been introduced into the vacuum chamber 14 under low pressure conditions. That is, the RF sources 20 and 21 supply energy through the impedance matching devices 22 and 23 to the coils 18 and 19 respectively. This energy is transferred to the gaseous mixture in the chamber 14 through the dome 16. As a result, a high density plasma is formed. A plasma may be thought of as a neutral ionized gas that is formed by free electrons reacting with gaseous molecules to produce highly energetic and reactive species such as ions, radicals, and other energetic atoms. Typically, a dense (# ions/cm$^3$) plasma is formed with a greater magnitude of power supplied to the chamber 14. Depending upon the selected processing parameters, the reactive species (i.e. ions, deposition precursors or chemically reactive etchants) may react with the substrate 12 to deposit a film or etch a film, as will be described.

A temperature controlled electrostatic chuck 24 may support the substrate 12 within the chamber 14. Further, the chuck 24 may be capacitively coupled to the bias RF source 26 through an impedance matching device 28. Typically, the bias RF 26 may provide between about 100 to 5,000 Watts of power at 13.56 MHz.

Generally, the plasma is separated from the substrate 12 by a sheath. The bias RF source 26 may facilitate ion bombardment of the substrate 12 by providing energy to the ions so that they are accelerated across the sheath. As a result, the bias RF source 26 may be utilized to control the energy in which ions bombard the surface of the substrate 12, which affects the degree of sputtering. Additionally, characteristics of the sheath and energy imparted to the charged plasma species may provide directionality to the plasma species. Typically, the sheath has an electric field that is perpendicular to the surface of the substrate 12. As a result, ions accelerated across the sheath tend to bombard the substrate 12 in a direction that is parallel to this field. Bias RF energy promotes this directionality.

Referring to FIG. 2, a gap 30 on the substrate 12 is to be filled with a fill material by HDP-CVD. The gap 30 may be any type of space such as a trench or via. Further, the gap 30 may occur between devices on the substrate 12 or between features of a specific device. For exemplary purposes, the gap 30 described herein is two-dimensional having a width and a height. However, embodiments of the present invention are not limited to spaces that have a generally rectangular cross sectional view.

The material to be deposited within gap 30 may be any suitable fill material such as a conductor or a dielectric. For the purpose of illustration, a silicon dioxide layer is first deposited within gap 30. Thereafter, the oxide layer is selectively etched to enable the subsequent deposition of silicon dioxide to fill the gap 30 free of voids. Embodiments of the invention are not limited to the deposition and removal of silicon dioxide; any material capable of deposition and etching may be utilized.

The gap 30 has a bottom 32, two sidewalls 34, an opening 36a having an initial pre-deposition width and two corners 38. The ratio of the depth to the width of the gap 30 is generally known as the aspect ratio, which may reflect the ease or difficulty of filling the gap 30. For example, a gap having a wider opening will be easier to fill than a gap of the same depth having a narrower opening. According to embodiments of the deposition-etch-deposition processes disclosed herein, gaps having aspect ratios as high as 5:1 and/or having initial openings of about 0.06 microns in width have been filled free of voids.

In general, HDP deposition processes may be characterized by the ratio of deposition (D) to sputtering (S). For example, when D/S ratio is low there is a high degree of sputtering. As a result, during deposition processing the substrate on which the material is being deposited risks being etched, especially at the corners. Moreover, the etched material may be redeposited, which leads to an increased risk of contamination. Further, when the D/S ratio is low a void may be formed due to the cross-sputtering and deposition of sputtered material near the opening of the gap to pinch off the gap opening.

When the D/S ratio is high deposition is favored over sputtering. Moreover, when utilizing a HDP deposition process having a high D/S ratio to fill a gap having a high aspect ratio, typically a void results. Generally, the void results because the deposition rate at various points on the wafer surface is different. For example, there may be greater deposition on the sidewall near the opening of the gap, which leads to the formation of cusps. Cusp formation may be due to a variety of reasons such as deposition precursor availability and/or redeposition of sputtered material. Nonetheless, when the D/S ratio is high, the cusps may grow to a point where they block the entry of deposition precursors into the gap. As a result, the gap is pinched off before it has been completely filled with the fill material.

According to embodiments of the present invention, for deposition, the preferred D/S ratio ranges between 10 and 30. Various controllable parameters may be adjusted to obtain a HDP process within the preferred range for deposition purposes. An incomplete list of controllable parameters includes the frequency and magnitude of the inductive RF power sources 20 and 21, the pressure within the chamber 14, the bias RF 26 power and frequency, the temperature of the chuck 24 and/or the dome 16, the gas composition and flow rate and the duration of the deposition process. Generally, the mechanisms of deposition may comprise ion-assisted plasma deposition, ion sputtering and re-deposition of the sputtered material. The interplay between these simultaneous processes determines the deposition rate, film quality and deposition profile.

A typical gas mixture for the deposition of silicon dioxide in HDP-CVD processes includes silane ($SiH_4$), oxygen ($O_2$) and argon (Ar). However, the composition of the gas mixture may differ depending upon the type or the properties of film to be grown. Generally, silane may be oxidized to form the silicon dioxide layer whereas argon or other ions sputter etch the forming oxide layer. Particularly, species such as $SiH_3$, $SiH_2$ and O radicals may be accelerated through the sheath toward the substrate 12 where chemical reactions take place to form the $SiO_2$ layer on the substrate 12 and in the gap 30. Simultaneously, ions may also be accelerated across the sheath to bombard the growing oxide layer, which may facilitate deposition at the bottom of the gap 30 by delaying the pinching off effect. Ion bombardment may also lead to the deposition of sputtered material.

The magnitude of the power and the frequency of the RF sources 20 and 21 affect the density of the plasma. For example, with HDP-CVD, inductive coupling of the RF sources 20 and 21 to the coils 18 and 19 respectively generates a higher density plasma at lower pressures as compared to other plasma processes. Advantageously, under low pressure conditions there is less angular deviation of the species from the surface normal, which may promote bottom fill of the gap 30. That is, because species are directional the deposition precursors and other reactive species are more likely to reach the bottom of the gap 30. Thus, the formation and directionality of deposition precursors and ions may be regulated, which may lead to better control over the deposition process itself. Moreover, in those embodiments that utilize two inductive RF sources such as RF sources 20 and 21, the radial ion density may be better controlled, which may improve plasma uniformity.

A high density plasma is believed to promote sputtering, which when excessive may adversely affect deposition. The bias RF 26 may be utilized to control sputtering in HDP-CVD. For example, the bias to the substrate 12 may be adjusted to control the energy of the ions bombarding the substrate 12 and to increase the directionality of ions and other species within the plasma. That is, the bias RF 26 imparts additional energy to the ions impinging upon the substrate 12 surface. By adjusting the magnitude of the bias 26 power, the energy of the ions bombarding the substrate 12 may be controlled. As a result, the degree of sputtering may also be controlled. Thus, the bias RF source 26 may be tuned to result in better bottom fill of the gap 30 by increasing the directionality of plasma species and controlling the energy of ion bombardment.

In sum, the power and frequency provided to the plasma via the inductive RF sources 20 and 21 and the capacitively coupled bias RF source 26 may be adjusted to decrease sputtering and promote deposition. Moreover, other parameters such as the gas flow rate and/or the composition of the gas mixture may be adjusted to facilitate deposition as well. According to embodiments of the present invention, adjustable parameters should yield an HDP-CVD deposition process having a D/S ratio between 10 and 30. Within this range, there is optimal bottom fill of the gap 30 and substrate 12 surface deposition while limiting the degree of sputtering.

Referring to FIG. 3, the gap 30 has been partially filled with a film 40 during the first deposition process. According to embodiments of the present invention, the HDP-CVD process used to fill gap 30 should have a D/S ratio between 10 and 30. Advantageously, with a D/S ratio between 10 and 30 there is maximum bottom fill of the gap 30 and deposition at the top or surface of the substrate 12. Additionally, the width of the original opening 36a is reduced by more than 50%. In other words, the width of the opening 36b post first deposition may be less than half of the width of the original opening 36a of the gap 30. Because deposition is favored, cusping regions 41a and 41b are formed at the corners 38 of the gap 30. Generally, the formation of cusps may be viewed as undesirable due to their potential to prematurely pinch off the gap 30 opening. However, according to embodiments of the present invention, the cusps 41a and 41b may protect the substrate 12 at the corners 38 during etch processing.

According to embodiments of the present invention, various parameters may be adjusted to result in an HDP-CVD deposition process characterized by a D/S ratio between 10 and 30. For example, top and side RF source generators 20 and 21 may be powered between 1 and 5 kW at about 2.0 MHz. Additionally, the bias RF 26 may be powered between 200 and 5,000 Watts at about 13.56 MHz. The pressure within the vacuum chamber 14 may range from a fraction of a millitorr to a few hundred millitorr. Further, in the case of silicon dioxide deposition, reactive gases introduced into the chamber 14 may include silane, oxygen and argon, with the oxygen to silane flow ratio being within the range of 1.5 to 3.0.

Particularly, using process parameters within the ranges given above, an HDP-CVD deposition process characterized by a D/S ratio in the range of 13–16 may be utilized to advantageously fill the gap 30 by more than 60%. Moreover, within this D/S range, the post deposition width 36b of the gap 30 may be less than 30% of the original gap width 36a. In other words, the width of the gap opening 36 may be reduced by more than 70%.

Figure 4:
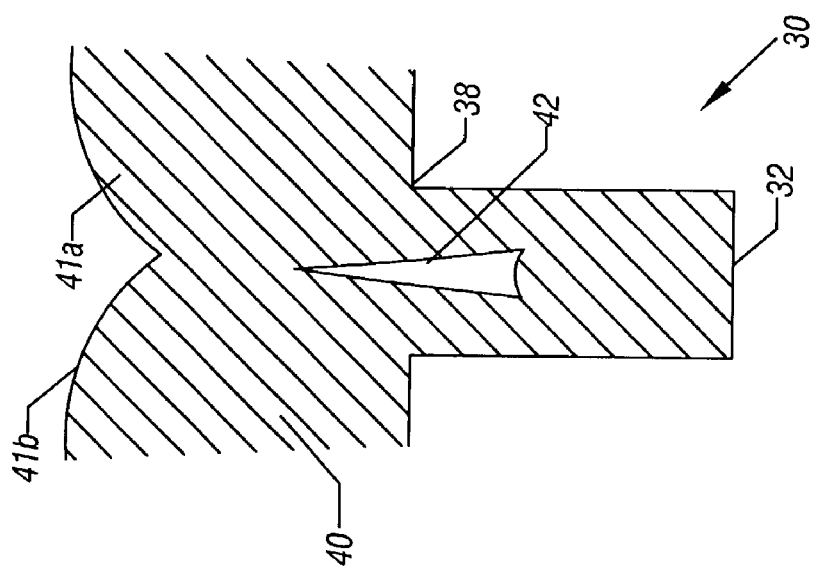
FIG. 4 is an enlarged cross-sectional view of a gap post-first deposition processing that is partially filled and that has had its opening deposited shut according to other embodiments of the present invention.

As shown in FIG. 3, in some embodiments the first deposition process may be terminated when the initial opening width 36a of the gap 30 is narrowed by about 50%. However, in other embodiments, as shown in FIG. 4, processing may proceed to a point where the initial opening 36a width of the gap 30 is narrowed by 100% before the gap 30 is filled with a deposited layer of silicon dioxide. That is, in some embodiments the initial deposition process may proceed to a point where the cusping regions 41a and 41b meet thereby closing or pinching the opening 36 off. As a result, the reactive species are prevented from accessing the gap 30 before the bottom 32 of the gap has been completely filled.

In embodiments where there is over deposition, the deposition process should still be characterized by a D/S ratio within the preferential range. Moreover, the controllable parameters may be adjusted as before, except the substrate 12 may be exposed to the plasma for a longer duration of time. For example, the inductive RF sources 20 and 21 may be powered between 1 and 5 kW at 2.0 MHz. Further, the bias RF 26 may be powered between 200 and 5,000 Watts at 13.6 MHz. Gases introduced into the chamber 14 may include silane, oxygen and argon and the oxygen/silane flow ratio of may range from 1.5 to about 3.0. Further, the pressure within the chamber 14 may be between less than 1 millitorr to a few hundred millitorr.

Advantageously, over deposition may yield a thick layer of silicon dioxide within the gap 30. Greater bottom fill of the gap 30 in the first deposition process may decrease the number of deposition-etch-deposition processes required to fill the gap 30, which in turn may increase throughput. Additionally, over deposition yields more deposition of silicon dioxide at the cusps 41a and 41b. Disadvantageously, when deposition processing progresses to the point where cusps 41a and 41b are joined, a void 42 results. However, the void 42 may be reversed during etch processing. Thus, the thick oxide layer 40 within the region of the joined cusps 41a and 41b may advantageously protect the substrate 12 from etching during void 42 reversal.

In some embodiments of the present invention, a single substrate 12 may be comprised of a plurality of gaps 30. During the initial deposition process, some gaps 30 may remain open, as shown in FIG. 3. However, during the same initial deposition process, other gaps 30 on the substrate 12 may be pinched off, as shown in FIG. 4. Nevertheless, each gap 30 will have the maximal bottom 32 fill during the initial deposition process.

In accordance with some embodiments of the present invention, each deposition and etch process may be conducted in-situ in the reactor 10. Accordingly, the substrate 12 is not handled or disturbed between processing steps, which decreases the incidence of contamination and increases throughput. Thus, the yield of high performance circuits is increased. However, in other embodiments of the present invention, deposition or etch processes only may take place in reactor 10.

Figure 5:
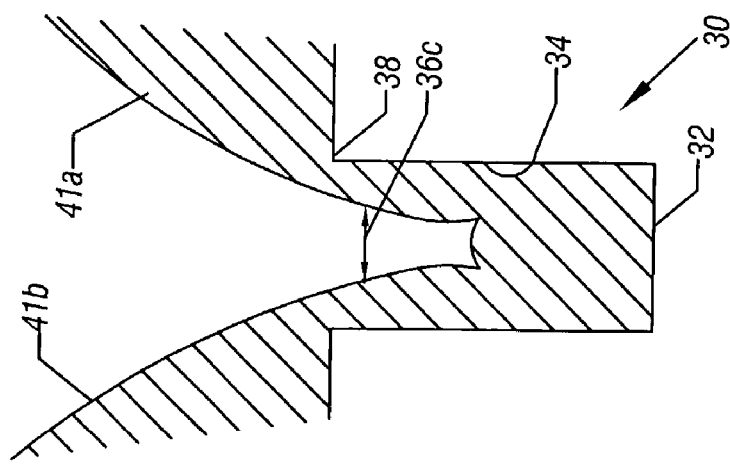
FIG. 5 is an enlarged cross-sectional view of the gap of FIG. 3 or FIG. 4 post-etch processing that has an opening of post-etch width according to embodiments of the present invention.

Referring to FIG. 5, after the initial deposition processing as shown in either FIG. 3 or FIG. 4, the film 40 may be etched to preferentially remove silicon dioxide from the cusping regions 41a and 41b. Preferential corner 38 oxide or cusp 41a and 41b removal widens the opening 36c of the gap 30 to a post-etch width. Alternately, etching may reverse the void 42 by preferentially removing the film 40 at the cusping regions 41a and 41b to create an opening 36c having a post-etch width. In either case, there is little or no etching of the oxide layer within the gap 30. As a result, the unfilled portion of the gap 30 should have an aspect ratio, post-etch, that favors subsequent gap-fill that is free of voids 42.

Preferential corner 38 oxide or cusp 41a and 41b removal may be the result of the combination of chemical and physical etching by energized species within a high density etch plasma. For example, as with deposition, inductive power supplied to a gas mixture within the chamber 14 results in a high density plasma at low pressure. Ions and other energized species within the high density etch plasma are accelerated across the sheath to interact with the substrate 12. For example, with isotropic HDP dry chemical etch, a gas mixture comprising a fluorine source may yield fluorine atoms that interact with the silicon dioxide layer 40 via well known chemical reactions. Reaction products are volatile and are removed from the chamber 14. Thus, etching may take place chemically via isotropic dry chemical etching.

Simultaneously, the capacitively coupled bias RF 26 may provide additional energy and directionality to ions bombarding the substrate 12 for a non-selective anisotropic physical etch. Generally, a high RF bias favors $SiO_2$ removal at the cusps 41a and 41b or corners 38. Without a high RF bias, there will be little cusp/corner etching. In the case of a high RF bias, ion bombardment is perpendicular to the substrate 12 surface so that the etch rate is higher at the curved cusping regions 41a and 41b. Anisotropically etched material may be removed from the chamber 14 without deposition elsewhere.

In some embodiments of the present invention, the substrate 12 may remain in the reactor 10 for etch processing. However, in other embodiments of the present invention, the substrate 12 may be removed and placed in a different device specific for etch purposes. Nevertheless, process parameters are modified to facilitate etch processing. According to embodiments of the present invention, for preferential corner 38 oxide or cusp 41a and 41b removal, the etch process parameters may be adjusted to yield a HDP etch process characterized by a D/S ratio of about 0. For example, the power of the inductive RF sources 20 and 21 may be between 100 and 5,000 Watts at 2.0 MHz. Similarly, the power of the capacitively coupled bias RF source 26 may be between 100 and 5,000 Watts, but at 13.5 MHz. Further, the pressure within the vacuum chamber 14 may be between 2 and 50 millitorr.

The etchant gas mixture may be varied but generally comprises a fluorine source such as $NF_3$, $SF_6$, $SiF_4$ or a fluorocarbon such as $CF_4$, $C_2F_6$ or $C_3F_8$. The etch gas mixture may also optionally include argon, hydrogen, oxygen, nitrogen, neon or helium. As previously stated, the fluorine source may yield species that chemically react with silicon dioxide. Moreover, the addition of argon, neon or helium may accelerate etching and facilitate corner 38 oxide or cusp 41a and 41b removal. In particular, argon may serve to control sputtering for the preferential removal of oxide from the corner 38 or the cusping regions 41a and 41b of the gap 30.

When a fluorocarbon is utilized as an etchant gas, the sidewalls 34 may be protected from etching. Generally, carbon fragments in the plasma react with the fluorine to decrease fluorine density. However, the presence of oxygen including oxygen from the film 40 will increase silicon dioxide etching. In some embodiments, hydrogen may also be added to the fluorocarbon gas mixture, which may increase silicon dioxide etching and promote the selective etch of silicon dioxide over silicon. Generally, selectivity is the etch rate of the film being etched as compared to the etch rate of the underlying material.

In some embodiments, in addition to preferential corner 38 oxide or cusping region 41a and 41b removal, there may be a limited selectivity of silicon dioxide etching over silicon nitride etching utilizing $NF_3$ and nitrogen gas. Generally, the ratio for selectivity of silicon dioxide to silicon nitride may be between 0.5 and 2. In these embodiments, the controllable processes parameters are within the previously stated ranges. However, the etch gas mixture typically includes $NF_3$, $N_2$ and typically, the flow rate for both $NF_3$ and $N_2$ gas is between 20 and 500 standard cubic centimeter minutes (sccm). Any one of hydrogen, argon or oxygen may be added to an $NF_3$ etch gas. In particular, argon is useful in corner oxide removal if desired. Moreover, when the ratio of $NF_3$ to $N_2$ is high, such as 4:1, selectivity of silicon dioxide etching over silicon nitride etching may be observed. Thus, the use of $NF_3$ as an etch gas in combination with nitrogen gas may result in selectivity of silicon dioxide over a silicon nitride substrate. Advantageously, there will be preferential removal of silicon dioxide, especially at the corners 38 or cusping regions 41a and 41b of the gap without etching of the underlying substrate.

In some embodiments, the etchant gas may be almost pure silicon tetrafluoride ($SiF_4$). In these embodiments, the controllable parameters are within the ranges indicated above, including a gas flow rate between 20 and 500 sccm. Argon, at a flow rate between 20 and 500 sccm may also be introduced into the vacuum chamber. Generally, argon may control sputtering and facilitate corner oxide 38 removal.

Referring to FIG. 6, after etch processing, the substrate may undergo further deposition processing to completely fill the gap 30 with film 40 free of voids 42. If the substrate 12 was removed to a different chamber for etch processing, it may be returned to the reactor 10 for the subsequent deposition processing. If however, the substrate 12 underwent etch processing within the reactor 10, the controllable parameters may be adjusted to facilitate deposition. Specifically, the parameters should be adjusted to produce a HDP process characterized within the preferential D/S range.

Generally, the controllable parameters will be within the same ranges as with the initial deposition processing. For example, the inductive RF sources 20 and 21 will be powered between 1 and 5 kW at a frequency of 2.0 MHz. Likewise, the RF bias 26 will be powered between 200 and 5,000 Watts at a frequency of 13.56 MHz. Moreover, the gas composition and ratios may also be within the ranges indicated for the initial deposition process. However, if deposition of a different film is desired, different parameters may be required.

Once the controllable parameters are adjusted to suit the particular gap-fill needs of the unfilled portion of the gap 30, the gap 30 may be filled with additional fill material. In doing so, the gap 30 may be filled void-free. In some embodiments of the present invention, the remainder of the gap 30 may be filled free of voids 42 in one subsequent deposition process. However, in other embodiments, the gap 30 may require additional rounds of etch and deposition processing to be filled free of voids 42.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a high density deposition plasma to deposit a film in at least one gap on the surface of a substrate at a deposition to sputter ratio between 10 and 30;
   providing a bias radio frequency source to drive a high density etch plasma at a frequency greater than 10 MHz; and
   providing an $NF_3/N_2$ etch gas mixture to selectively etch said film.

2. The method of claim 1 further including depositing said film in said gap to partially fill said gap.

3. The method of claim 2 further including depositing said film at the opening of said gap to form one or more cusping regions that narrow the initial width of the opening.

4. The method of claim 3 wherein depositing said film at the opening of said gap includes reducing the initial width of the opening of said gap by at least 50 percent.

5. The method of claim 3 wherein depositing said film at the opening of said gap includes reducing the initial width of the opening of said gap by 100 percent.

6. The method of claim 3 further including preferentially etching the deposited film at said cusping regions.

7. The method of claim 6 further including widening the narrowed opening of said gap to a post-etch width that is greater than the width after deposition, said widening to occur with little or no etching of the film at the bottom of the gap.

8. The method of claim 7 further including depositing a second film in said gap.

9. A method comprising:
   depositing a film in a gap on a substrate using a deposition plasma for high density plasma chemical vapor deposition, said deposition characterized by a deposition to sputter ratio between 10 and 30;
   stopping said deposition when said gap is partially filled and one or more cusping regions are formed at the opening of the gap that reduce the initial width of the gap; and
   providing a silicon tetrafluoride/argon gas mixture to preferentially etch the film at the cusping regions, using a high density etch plasma, said etch to widen the reduced opening of the gap to a post-etch width, said etch characterized by a deposition to sputter ratio of about 0 and driven, by a bias radio frequency source, at a frequency greater than 10 MHz.

10. The method of claim 9 wherein stopping said deposition when said gap is partially filled includes stopping said deposition when said gap is filled by at least about 50%.

11. The method of claim 9 further including reducing the width of the initial opening of the gap by between 50% and 100%.

12. The method of claim 9 wherein depositing said film in said gap includes depositing said film in a gap that has opening of an initial width of about 0.06 microns.

13. The method of claim 9 further including depositing said film and etching said film in a single reaction chamber.

14. The method of claim 9 further including depositing a second film in said partially filled gap.

15. The method of claim 14 further including repeating etching said film and depositing a subsequent film until said gap is filled free of voids.

16. A method comprising:
depositing a material in a gap on a substrate using high density plasma chemical vapor deposition characterized by a deposition to sputter ratio between 10 and 30; and
stopping deposition when the deposited material partially fills the gap and reduces a portion of the gap's width by about one half.

17. The method of claim 16 wherein depositing a material in a gap includes depositing the material at a deposition to sputter ratio above 20 to about 30.

18. The method of claim 16 including etching the deposited material using a high density etch plasma driven at a frequency greater than 10 MHz to selectively etch the deposited material and increase the gap's reduced width.

19. The method of claim 18 further including providing argon in an etch gas mixture.

20. The method of claim 19 further including providing silicon tetrafluoride in said etch gas mixture.

21. The method of claim 16 wherein depositing a material includes depositing the material at the opening of the gap to form a cusp.

22. The method of claim 21 including preferentially etching the deposited material at the cusp to increase the gap's width with little or no etching of the material deposited within the gap.

23. The method of claim 16 wherein stopping deposition includes stopping deposition when a void is formed in the partially filled gap.

24. The method of claim 23 further including preferentially etching the deposited material to reverse void formation.

25. The method of claim 23 including after said etch, depositing the material to fill the gap.

26. A method comprising:
forming a void in a gap on a substrate using high density plasma chemical vapor deposition to deposit a gap-fill material; and
selectively etching the gap-fill material using a high density etch plasma and an $NF_3/N_2$ etch gas mixture, said etching to reverse void formation.

27. The method of claim 26 wherein forming a void in a gap includes forming a void in a gap having pre-void width of about 0.06 microns.

28. The method of claim 26 wherein etching said gap-fill material includes etching said gap-fill material at a deposition to sputter ratio of about 0, said etch driven at a frequency greater than 10 MHz.

29. The method of claim 28 including filling the reversed void with a gap-fill material.

30. The method of claim 28 including forming a void in said gap and etching said gap-fill material sequentially in a single reaction chamber.

31. The method of claim 26 including depositing said gap-fill material, said deposition characterized by deposition to sputter ratio between 10 and 30.

32. The method of claim 31 wherein depositing said gap-fill material includes depositing at a deposition to sputter ratio above 20 to about 30.

33. The method of claim 26 wherein selectively etching the gap-fill material includes providing said etch gas mixture in a ratio of 4:1.

34. The method of claim 33 wherein selectively etching includes flowing oxygen into a reaction chamber at the same time as said $NF_3/N_2$ gas mixture.

* * * * *